(12) United States Patent
Shimomura et al.

(10) Patent No.: US 9,117,903 B2
(45) Date of Patent: Aug. 25, 2015

(54) SEMICONDUCTOR DEVICE

(71) Applicant: Renesas Electronics Corporation, Kawasaki-shi, Kanagawa (JP)

(72) Inventors: Akihiro Shimomura, Kawasaki (JP); Yutaka Akiyama, Kawasaki (JP); Saya Shimomura, Kawasaki (JP); Yasutaka Nakashiba, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 10 days.

(21) Appl. No.: 14/204,145

(22) Filed: Mar. 11, 2014

(65) Prior Publication Data

US 2014/0284709 A1 Sep. 25, 2014

(30) Foreign Application Priority Data

Mar. 25, 2013 (JP) .................. 2013-061474

(51) Int. Cl.
| | | |
|---|---|---|
| *H01L 29/78* | (2006.01) | |
| *H01L 29/423* | (2006.01) | |
| *H01L 29/808* | (2006.01) | |
| *H01L 29/40* | (2006.01) | |
| *H01L 29/739* | (2006.01) | |

(52) U.S. Cl.
CPC .......... *H01L 29/7827* (2013.01); *H01L 29/407* (2013.01); *H01L 29/4236* (2013.01); *H01L 29/7397* (2013.01); *H01L 29/7813* (2013.01); *H01L 29/8083* (2013.01)

(58) Field of Classification Search
CPC ............ H01L 29/7827; H01L 29/4236; H01L 29/7813; H01L 29/407; H01L 29/404; H01L 29/7397; H01L 29/7802; H01L 29/8083
USPC .......... 257/330, 331, 488, 409, 328, E29.311, 257/E29.26
See application file for complete search history.

(56) References Cited

U.S. PATENT DOCUMENTS

| | | | |
|---|---|---|---|
| 6,316,807 B1 * | 11/2001 | Fujishima et al. | 257/333 |
| 7,005,352 B2 * | 2/2006 | Fujishima et al. | 438/270 |
| 7,056,793 B2 * | 6/2006 | Fujishima | 438/268 |
| 7,109,551 B2 * | 9/2006 | Sugi et al. | 257/330 |
| 7,323,386 B2 | 1/2008 | Yilmaz | |
| 7,791,135 B2 * | 9/2010 | Ueno | 257/330 |
| 2010/0072543 A1 * | 3/2010 | Hsieh | 257/331 |

* cited by examiner

*Primary Examiner* — Michael Trinh
(74) *Attorney, Agent, or Firm* — Sughrue Mion, PLLC

(57) ABSTRACT

A buried layer of a second conductivity type and a lower layer of a second conductivity type are formed in a drift layer. A boundary insulating film is formed in the boundary between the lateral portion of the buried layer of a second conductivity type and the drift layer. The lower layer of a second conductivity type is in contact with the lower end of the buried layer of a second conductivity type and the lower end of the boundary insulating film. The buried layer of a second conductivity type is electrically connected to a source electrode. A high-concentration layer of a second conductivity type is formed in the surface layer of the buried layer of a second conductivity type.

13 Claims, 14 Drawing Sheets

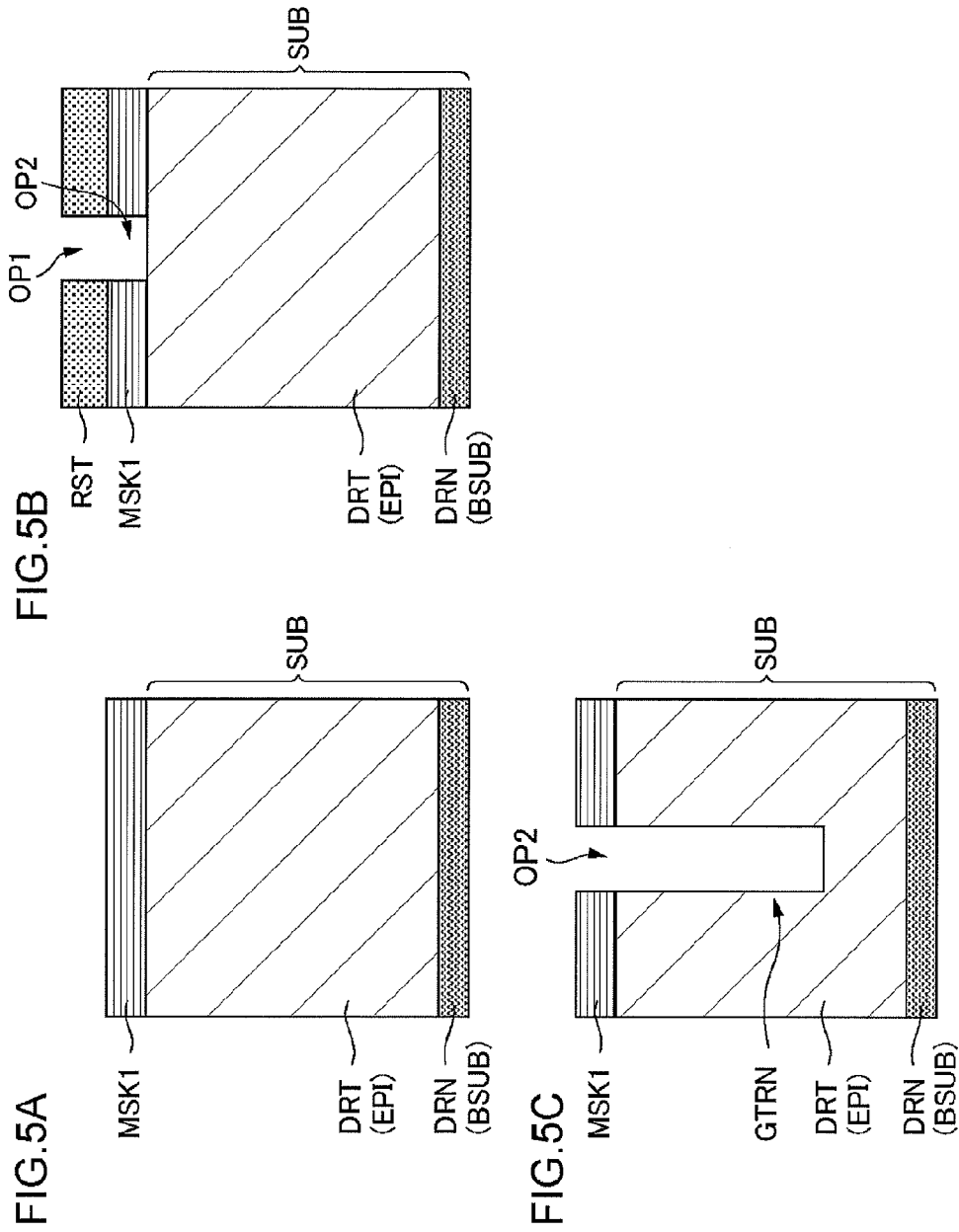

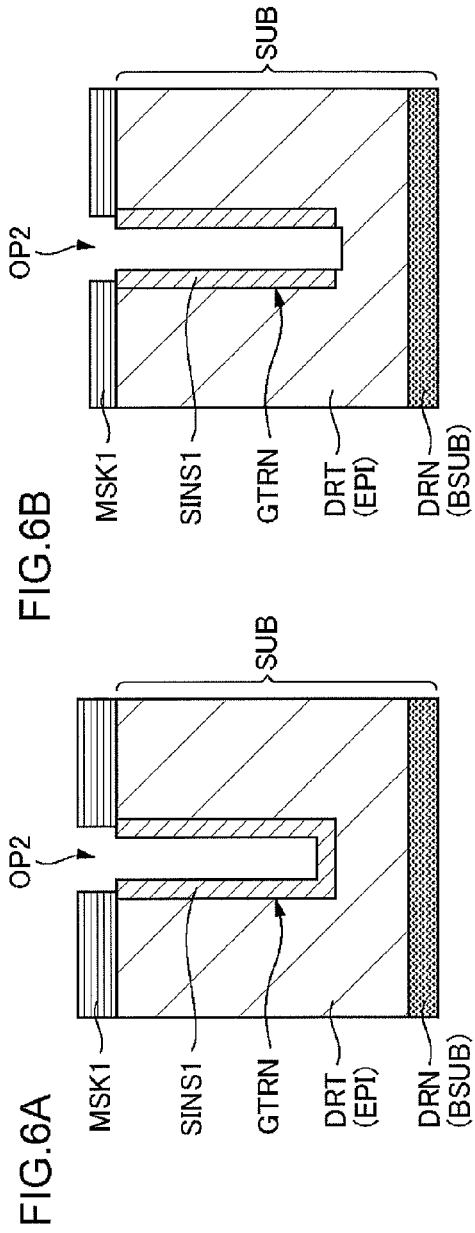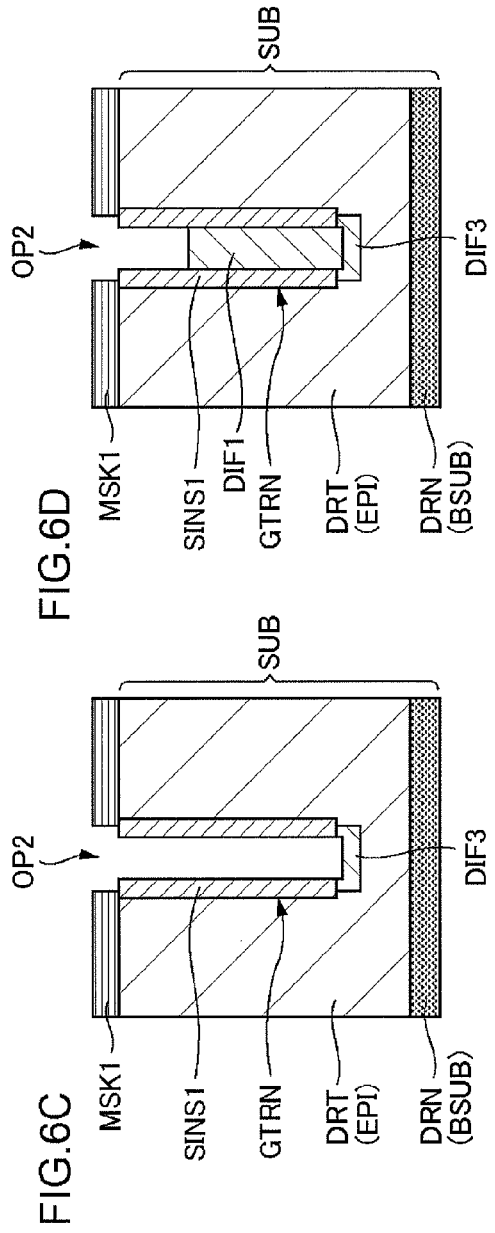

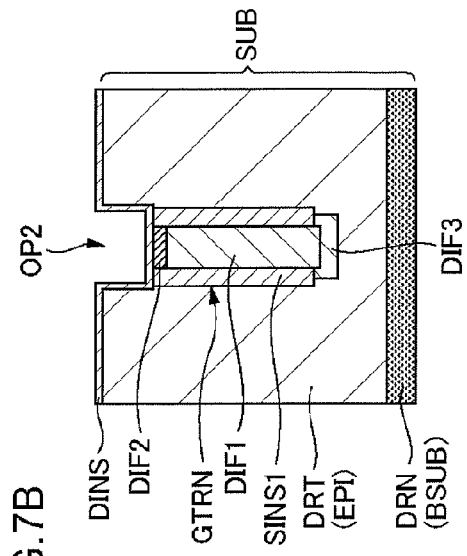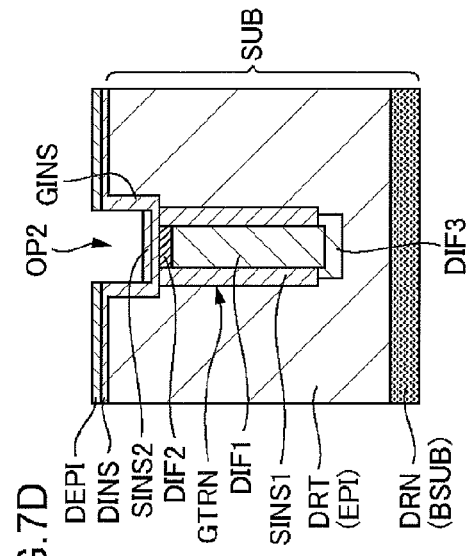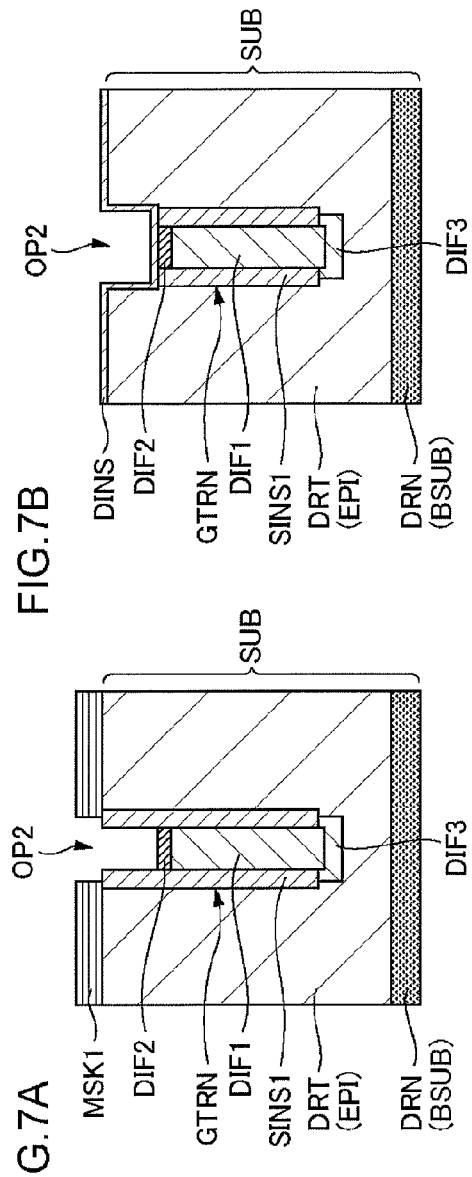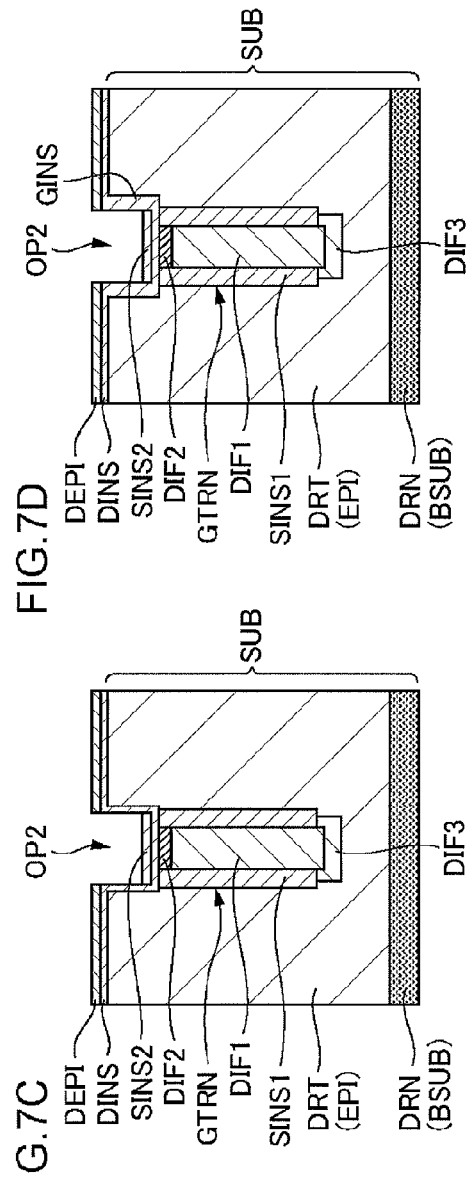

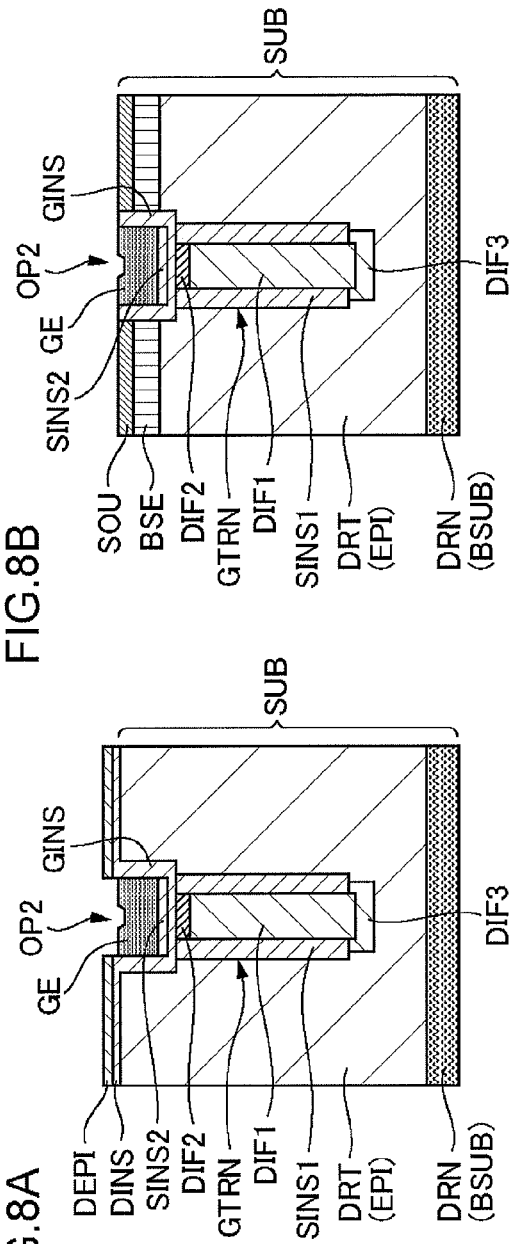

Vds=60V

SEMICONDUCTOR DEVICE

This application is based on Japanese patent application No. 2013-061474, the content of which is incorporated hereinto by reference.

BACKGROUND

1. Technical Field

The present invention relates to a semiconductor device, and to a technique applicable to, for example, a semiconductor device including a vertical transistor.

2. Related Art

A semiconductor device is known to have a vertical transistor. The vertical transistor is used in, for example, an element that controls a large current. The vertical transistor is known to have a trench gate structure. As the vertical transistor having a trench gate structure, there is a technique disclosed in, for example, Specification of U.S. Pat. No. 7,323,386. In Specification of U.S. Pat. No. 7,323,386, the transistor has a structure in which an N layer and a P layer serving as a base are formed on an $N^+$ layer serving as a drain, and an $N^+$ layer serving as a source is further formed on a surface layer of the P layer. A gate electrode having a trench structure stretches from the P layer toward the N layer. The lower end of the gate electrode gains entrance to the N layer.

In Specification of U.S. Pat. No. 7,323,386, a P shield layer is formed in the lower portion of a trench, instead of the gate electrode. An insulating film is formed between the gate electrode and the P shield layer, and a sidewall insulating film is formed between the P shield layer and the N layer. Further, Specification of U.S. Pat. No. 7,323,386 discloses that the P shield layer and the sidewall insulating film are formed within a separate trench from a gate, and the P shield layer is connected to a source electrode.

A low on-resistance and a high withstanding voltage against a drain voltage are required for the vertical transistor. However, generally, a decrease in on-resistance and an increase in withstanding voltage are in a trade-off relationship, and thus are not likely to be made compatible with each other at a high level.

Other problems and novel features will be made clearer from the description and the accompanying drawings of the present specification.

SUMMARY

In one embodiment, a buried layer of a second conductivity type and a lower layer of a second conductivity type are formed in a second layer of a first conductivity type serving as a drift layer. A boundary insulating film is formed in a boundary between a lateral portion of the buried layer of a second conductivity type and a first layer of a first conductivity type. The lower layer of a second conductivity type is in contact with the buried layer of a second conductivity type and a lower end of the boundary insulating film.

According to the embodiment, it is possible to make a decrease in on-resistance and an increase in withstanding voltage compatible with each other at a high level.

BRIEF DESCRIPTION OF THE DRAWINGS

The above and other objects, advantages and features of the present invention will become more apparent from the following description of certain preferred embodiments taken in conjunction with the accompanying drawings, in which:

FIGS. 5A to 5C are cross-sectional views illustrating a method of manufacturing the semiconductor device.

FIGS. 6A to 6D are cross-sectional views illustrating a method of manufacturing the semiconductor device.

FIGS. 7A and 7D are cross-sectional views illustrating a method of manufacturing the semiconductor device.

FIGS. 8A and 8B are cross-sectional views illustrating a method of manufacturing the semiconductor device.

DETAILED DESCRIPTION

Figure 1:
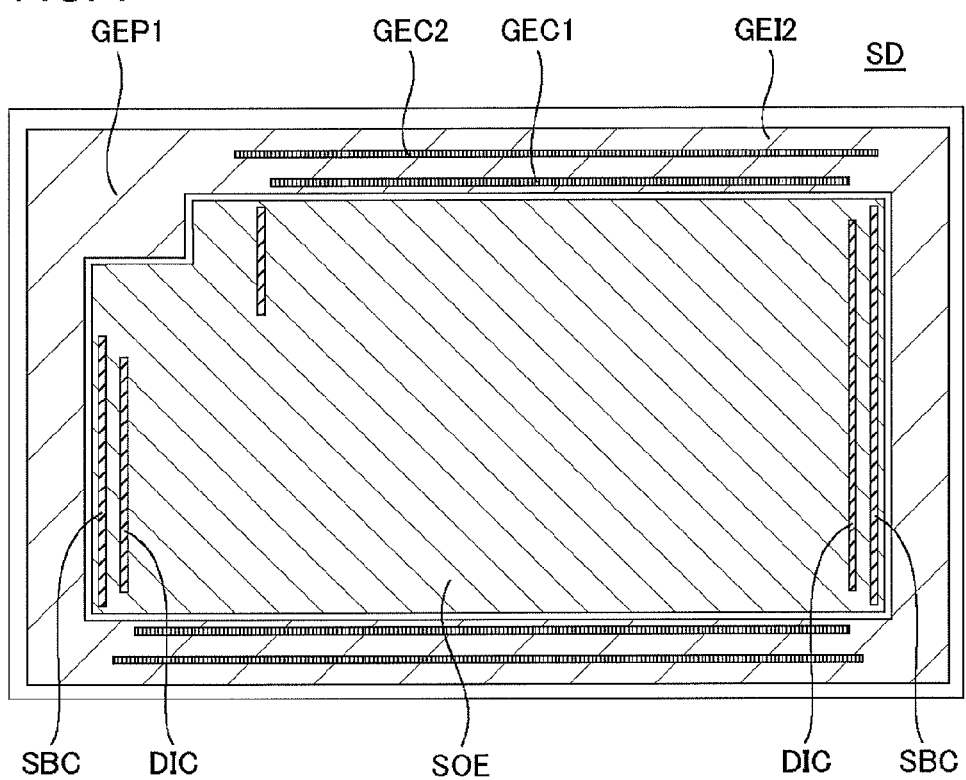
FIG. 1 is a top view illustrating a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the invention will be described with reference to the accompanying drawings. In all the drawings, like elements are referenced by like reference numerals and descriptions thereof will not be repeated.

(First Embodiment)

Figure 2:
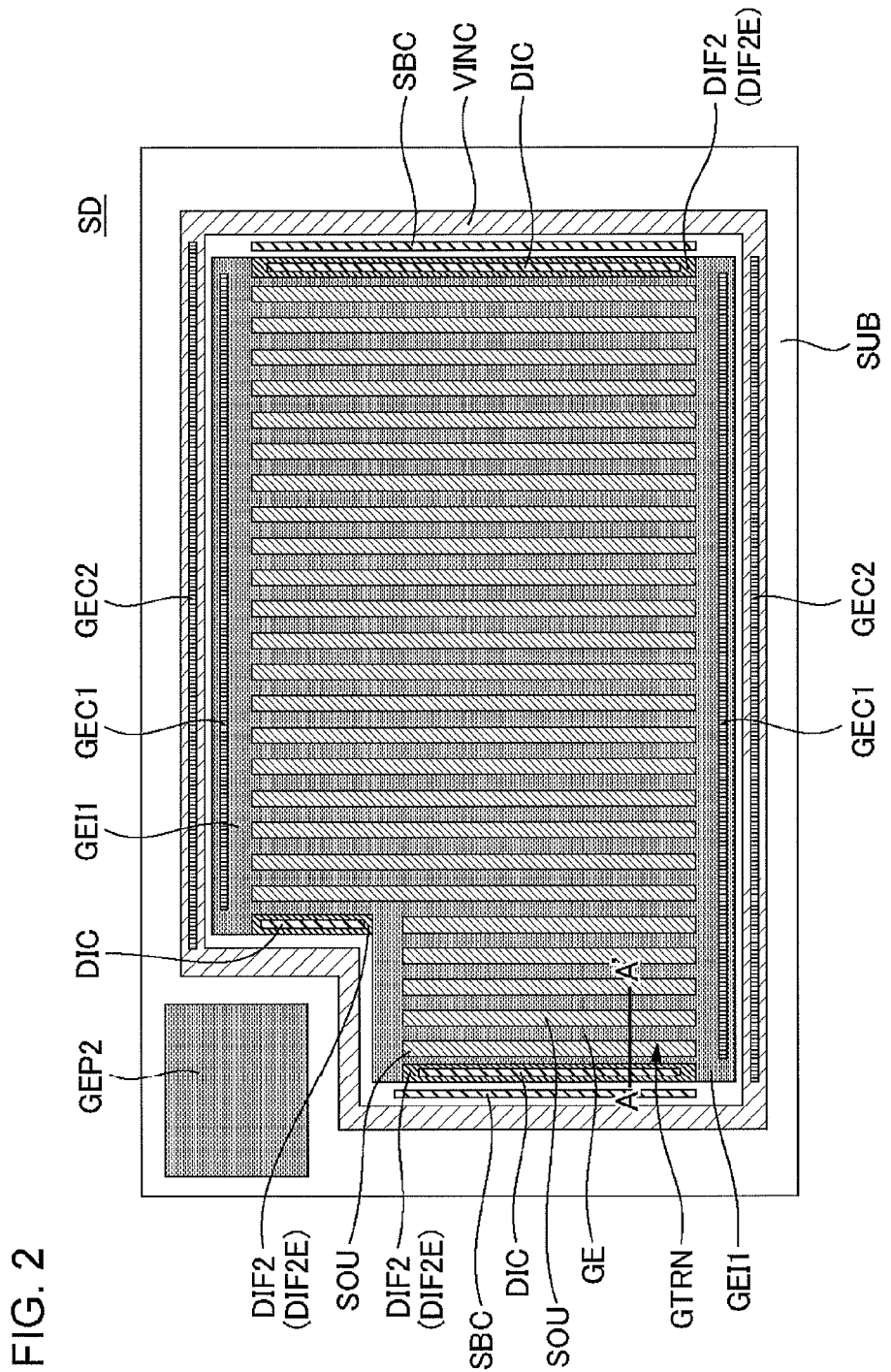
FIG. 2 is a diagram in which a gate pad, a gate interconnect, and a source electrode are removed from FIG. 1.

FIG. 1 is a top view illustrating a semiconductor device SD according to a first embodiment. FIG. 2 is a diagram in which a gate pad GEP1, a gate interconnect GEI2, and a source electrode SOE are removed from FIG. 1.

The semiconductor device SD includes a vertical transistor. As shown in FIG. 2, a gate electrode GE of the vertical transistor is, for example, a polysilicon layer, and is buried in a gate trench GTRN formed in the surface layer of a semiconductor substrate SUB. A plurality of gate electrodes GE and a plurality of gate trenches GTRN are provided in parallel to each other. Two gate interconnects GEI1 are formed so as to interpose the gate electrodes GE and the gate trenches GTRN therebetween. The plurality of gate electrodes GE are all configured such that both ends thereof are connected to the gate interconnects GEI1. The gate interconnects GEI1 are formed integrally with the gate electrodes GE, and are buried in the gate trenches GTRN, similarly to the gate electrodes GE.

Both the two gate interconnects GEI1 are connected to the gate interconnect GEI2 (see FIG. 1) through contacts GEC1. The gate interconnect GEI2 surrounds the plurality of gate electrodes GE when seen in a plan view, and a portion thereof overlaps the gate interconnects GEI1. A portion of the gate electrodes GE serves as the gate pad GEP1. The gate pad GEP1 serves as a terminal that connects the gate electrode and the outside. Meanwhile, as shown in FIG. 2, an underlying pad GEP2 is formed in a portion overlapping the gate pad GEP1, when seen in a plan view, in the semiconductor substrate SUB. The underlying pad GEP2 has the same structure as that of the gate electrode GE, and is configured to have a structure in which the same conductive layer as that of the gate electrode GE is buried in a concave portion formed in the semiconductor substrate SUB.

As shown in FIG. 1, the source electrode SOE is formed in a region surrounded by the gate interconnect GEI2. The source electrode SOE is located on the same layer as the layer having the gate interconnect GEI2 located thereon, and overlaps a region located between gate electrodes GE and over the gate electrode GE when seen in a plan view. As shown in FIG. 2, a source layer SOU is formed in a region located between the gate electrodes GE in one surface of the semiconductor substrate SUB. The source layer SOU is connected to the source electrode SOE through a contact SOC (not shown in FIGS. 1 and 2).

In addition, as shown in FIG. 2, a buried conductive layer VINC is buried in the semiconductor substrate SUB. The buried conductive layer VINC is buried within a trench formed in the semiconductor substrate SUB, and surrounds the gate interconnect GEI1, the plurality of gate electrodes GE, and a plurality of source layer SOU, when seen in a plan view. The buried conductive layer VINC is connected to the gate interconnect GEI2 through a contact GEC2.

A high-concentration layer DIF2 of a second conductivity type is formed inside a region surrounded by the buried conductive layer VINC in the semiconductor substrate SUB. The high-concentration layer DIF2 of a second conductivity type is configured such that a portion thereof protrudes to the surface of the semiconductor substrate SUB to serve as an exposed region DIF2E, and is connected to the source electrode SOE through a contact DIC in the exposed region DIF2E. In the example shown in the drawing, the exposed region DIF2E is located outside a region in which the plurality of gate electrodes GE are formed, and is formed in parallel to the gate electrodes GE. That is, when seen in a plan view, the plurality of gate electrodes GE are interposed by the exposed region DIF2E. Both ends of the exposed region DIF2E are connected to the gate interconnect GEI1.

In addition, the region surrounded by the buried conductive layer VINC in the semiconductor substrate SUB is connected to the source electrode SOE through a contact SBC. In the example shown in the drawing, the contact SBC is located between the buried conductive layer VINC and the exposed region DIF2E, when seen in a plan view.

Figure 3:
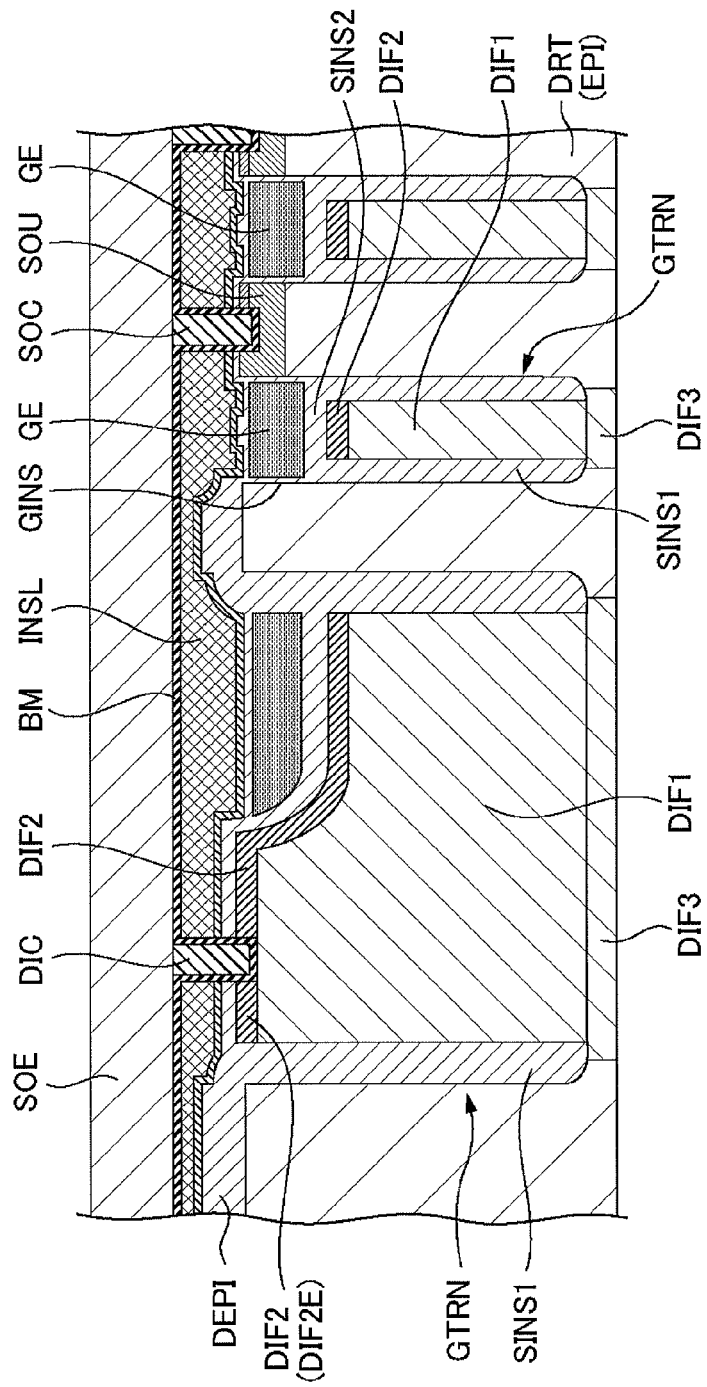
FIG. 3 is a cross-sectional view taken along line A-A' of FIG. 2.
Figure 4:
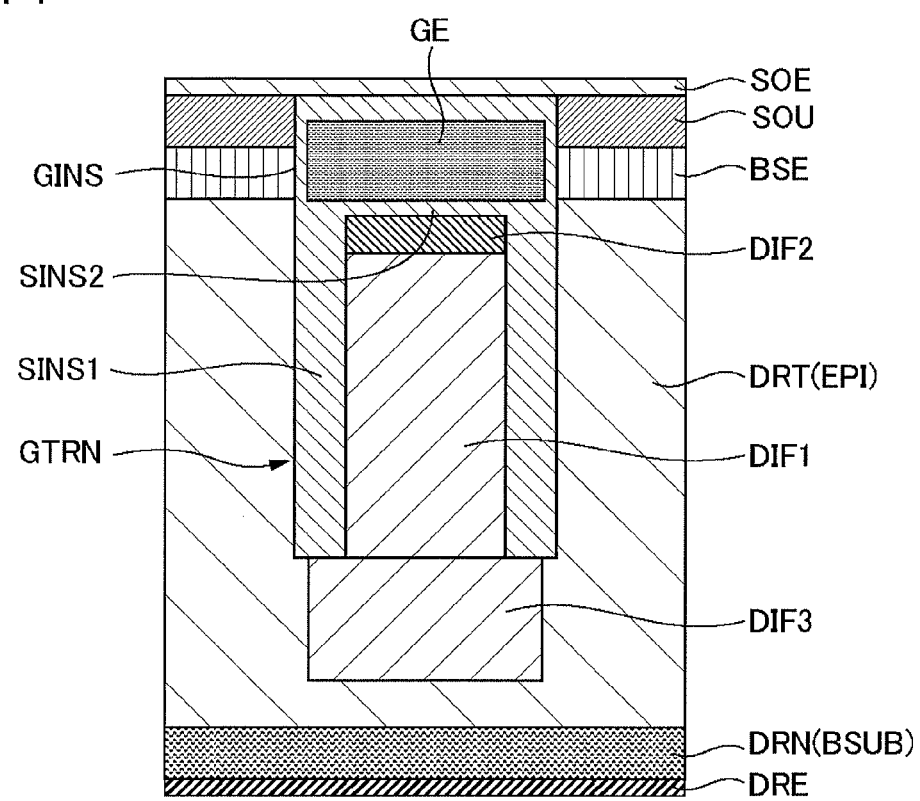
FIG. 4 is a cross-sectional view illustrating a structure of a vertical transistor.

FIG. 3 is a cross-sectional view taken along line A-A' of FIG. 2. FIG. 4 is a cross-sectional view illustrating a structure of the vertical transistor. Meanwhile, in FIG. 2, an insulating interlayer INSL shown in FIG. 3 is not shown. In addition, in FIG. 3, the source electrode SOE is shown for the purpose of illustration. In the following description, a first conductivity type is set to an N type, and a second conductivity type is set to a P type. However, the first conductivity type may be set to a P type, and the second conductivity type may be set to an N type.

The semiconductor substrate SUB is configured such that an N-type epitaxial layer EPI serving as a drift layer DRT (first layer of a first conductivity type) is laminated on an $N^+$-type base substrate BSUB serving as a drain layer DRN. The base substrate BSUB is, for example, a bulk silicon substrate. The epitaxial layer EPI is a silicon layer epitaxially grown on the base substrate BSUB.

A P-type base layer BSE (layer of a second conductivity type) and an $N^+$-type source layer SOU (second layer of a first conductivity type) are formed in the surface layer of the epitaxial layer EPI. A portion which does not serve as the source layer SOU and the base layer BSE in the epitaxial layer EPI serves as the drift layer DRT. The source layer SOU is located in the surface layer of the epitaxial layer EPI, and the base layer BSE is located between the source layer SOU and the drift layer DRT.

The gate trench GTRN is provided in the epitaxial layer EPI, and passes through the source layer SOU and the base layer BSE. The lower end of the gate trench GTRN is located at the drift layer DRT. The gate electrode GE is buried in a portion overlapping the base layer BSE in a thickness direction in the gate trench GTRN.

A buried layer DIF1 of a second conductivity type and a lower layer DIF3 of a second conductivity type are formed in the drift layer DRT. A boundary insulating film SINS1 is formed in the boundary between the lateral portion of the buried layer DIF1 of a second conductivity type and the drift layer DRT. The lower layer DIF3 of a second conductivity type is in contact with the lower end of the buried layer DIF1 of a second conductivity type and the lower end of the boundary insulating film SINS1. The buried layer DIF1 of a second conductivity type is electrically connected to the source electrode SOE. Meanwhile, in the example shown in the drawing, the lower layer DIF3 of a second conductivity type covers the entirety of the buried layer DIF1 of a second conductivity type, when seen in a plan view. In addition, the lower layer DIF3 of a second conductivity type is formed so as to extend to a position deeper than the lower end of the boundary insulating film SINS1 and the lower end of the buried layer DIF1 of a second conductivity type in the depth direction of the semiconductor substrate SUB. The lower layer DIF3 of a second conductivity type is in contact with, for example, the entire lower end of the buried layer DIF1 of a second conductivity type, and is formed so as to extend to a position deeper than the lower end face.

In the present embodiment, the high-concentration layer DIF2 of a second conductivity type is formed in the surface layer of the buried layer DIF1 of a second conductivity type. As mentioned above, a portion of the high-concentration layer DIF2 of a second conductivity type is exposed to the surface of the semiconductor substrate SUB, and serves as the exposed region DIF2E shown in FIG. 2. The exposed region DIF2E is connected to the source electrode SOE through the contact DIC. That is, the buried layer DIF1 of a second conductivity type is connected to the source electrode SOE through the high-concentration layer DIF2 of a second conductivity type and the contact DIC.

In the example shown in the drawing, the buried layer DIF1 of a second conductivity type and the boundary insulating film SINS1 are formed using the lower portion of the gate trench GTRN. Specifically, the boundary insulating film SINS1 is formed in the lower portion of a sidewall of the gate trench GTRN. In addition, the buried layer DIF1 of a second conductivity type is buried in the lower portion of the gate trench GTRN. The buried layer DIF1 of a second conductivity type is, for example, a P-type polysilicon layer. For this reason, the buried layer DIF1 of a second conductivity type overlaps the gate electrode GE when seen in a plan view, and the upper portion of the boundary insulating film SINS1 is connected to the lower portion of a gate insulating film GINS. Meanwhile, a boundary insulating film SINS2 is formed between the gate electrode GE and the buried layer DIF1 of a second conductivity type.

The gate insulating film GINS and the gate electrode GE are not formed in a portion serving as the exposed region DIF2E shown in FIG. 2 in the gate trench GTRN, but the high-concentration layer DIF2 of a second conductivity type is located at the upper end.

In addition, a drain electrode DRE is formed on the surface of the base substrate BSUB which is opposite to the epitaxial layer EPI. As mentioned above, the source electrode SOE is formed on one surface side of the semiconductor substrate SUB. A voltage equal to or higher than 80 V, for example, equal to or higher than 100 V is applied between the drain electrode DRE and the source electrode SOE.

Meanwhile, the insulating interlayer INSL is formed between the source electrode SOE and the gate interconnect GEI2, and the semiconductor substrate SUB. The insulating interlayer INSL is, for example, a silicon oxide film. Each of the contacts (for example, contacts DIC, SOC, GEC1, GEC2, and SBC) is buried in the insulating interlayer INSL. A barrier metal film BM is formed between the source electrode SOE and the gate interconnect GEI2, and the insulating interlayer INSL, and between each contact and the insulating interlayer INSL. The barrier metal film BM is also formed at the bottom of each contact.

Meanwhile, the source electrode SOE, the gate interconnect GEI2, and the drain electrode DRE are formed of, for example, Al. Each of the contacts may be formed of metal (for example, W) different from that of the source electrode SOE, and may be formed of the same metal as that of the source electrode SOE. In the latter case, each of the contacts is formed in the same process as that of the source electrode SOE.

FIGS. 5A to 8B are cross-sectional views illustrating a method of manufacturing the semiconductor device SD. First, the base substrate BSUB having the epitaxial layer EPI formed thereon is prepared. Next, as shown in FIG. 5A, a mask film MSK1 is formed on the epitaxial layer EPI. The mask film MSK1 is, for example, a silicon oxide film.

Next, as shown in FIG. 5B, a resist pattern RST is formed on the mask film MSK1. The resist pattern RST has an opening OP1 on a region serving as the gate trench GTRN, and on a region in which the buried conductive layer VINC is formed. Next, the mask film MSK1 is etched using the resist pattern RST as a mask. Thereby, an opening OP2 is formed on the region serving as the gate trench GTRN in the mask film MSK1.

Thereafter, as shown in FIG. 5C, the resist pattern RST is removed. Next, the drift layer DRT is etched using the mask film MSK1 as a mask. Thereby, the gate trench GTRN is formed. In addition, a trench for burying the buried conductive layer VINC and a concave portion for burying the underlying pad GEP2 are also formed by this process.

Next, as shown in FIG. 6A, the epitaxial layer EPI is thermally oxidized using the mask film MSK1 as a mask. Thereby, the boundary insulating film SINS1 is formed at the side and bottom of the gate trench GTRN. Next, as shown in FIG. 6B, a portion located at the bottom of the gate trench GTRN in the boundary insulating film SINS1 is removed using an anisotropic etching method.

Next, as shown in FIG. 6C, a P-type impurity ion is implanted into the epitaxial layer EPI using the mask film MSK1 as a mask. Thereby, the lower layer DIF3 of a second conductivity type is formed at the bottom of the gate trench GTRN.

Next, as shown in FIG. 6D, for example, a P-type polysilicon film is formed on the mask film MSK1 and in the gate trench GTRN, using a CVD method. Thereafter, a portion located at the upper portion in the polysilicon film located on the mask film MSK1 and the polysilicon film located in the gate trench GTRN is removed using an etch-back method. Thereby, the buried layer DIF1 of a second conductivity type is buried in the lower portion of the gate trench GTRN. Meanwhile, in this process, a portion in which the exposed region DIF2E of the high-concentration layer DIF2 of a second conductivity type is formed in the buried layer DIF1 of a second conductivity type is prevented from being etched back. For this, for example, a resist pattern is used.

Next, as shown in FIG. 7A, a P-type impurity is ion-implanted into the surface layer of the buried layer DIF1 of a second conductivity type, using the mask film MSK1 as a mask. Thereby, the high-concentration layer DIF2 of a second conductivity type is formed in the surface layer of the buried layer DIF1 of a second conductivity type. Meanwhile, in this case, a resist pattern may be formed on the mask film MSK1.

Thereafter, as shown in FIG. 7B, the mask film MSK1 is removed. Next, a portion which is not covered with the buried layer DIF1 of a second conductivity type in the boundary insulating film SINS1 is removed by wet etching. Next, the epitaxial layer EPI is thermally oxidized. Thereby, a thermal oxide film DINS is formed. In this case, the surface layer of the high-concentration layer DIF2 of a second conductivity type is also thermally oxidized. The thermal oxide film serves as a portion of the boundary insulating film SINS2.

Next, as shown in FIG. 7C, a buried insulating film DEPI is formed in the gate trench GTRN and on the epitaxial layer EPI using, for example, a CVD method. Thereby, the boundary insulating film SINS2 is formed. That is, the boundary insulating film SINS2 is a laminated film of the buried insulating film DEPI and the thermal oxide film. In this process, the buried insulating film DEPI is also formed on the epitaxial layer EPI.

Next, as shown in FIG. 7D, the thermal oxide film DINS is removed. The gate insulating film GINS is formed using a thermal oxidation method.

Thereafter, as shown in FIG. 8A, a polysilicon film is formed in the gate trench GTRN and on the epitaxial layer EPI using, for example, a CVD method. Next, the polysilicon film located on the epitaxial layer EPI is removed using an etch-back method. Thereby, the gate electrode GE is formed. In addition, in this process, the gate interconnect GEI1, the buried conductive layer VINC, and the underlying pad GEP2 are also formed.

Next, as shown in FIG. 8B, the buried insulating film DEPI and the thermal oxide film DINS located on the epitaxial layer EPI are removed. Next, the source layer SOU and the base layer BSE are formed on the epitaxial layer EPI using an ion implantation method.

Thereafter, the insulating interlayer INSL, the barrier metal film BM, each contact, the source electrode SOE, the gate interconnect GEI2, and the drain electrode DRE are formed. In this manner, the semiconductor device SD is formed.

Figure 9:
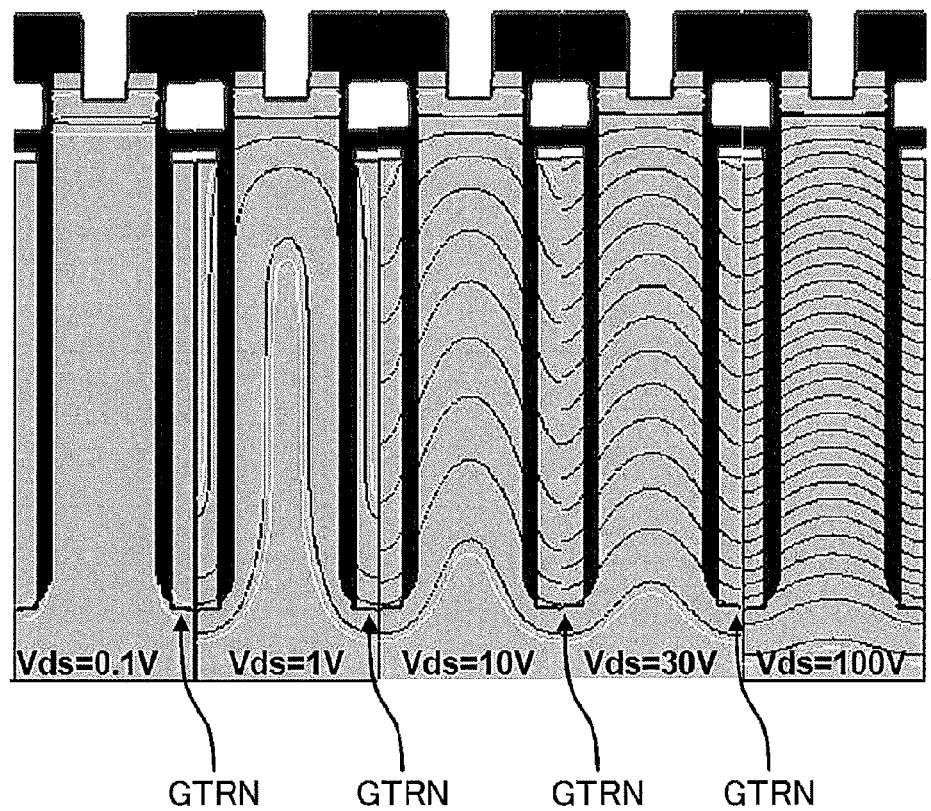
FIG. 9 is a diagram illustrating results obtained by simulating positions of an equipotential line and a depletion layer of the vertical transistor.

FIG. 9 is a diagram illustrating results obtained by simulating positions of an equipotential line and a depletion layer of the vertical transistor included in the semiconductor device SD according to the present embodiment. In the drawing, the equipotential line is shown by black lines. From the drawing, even when a voltage Vds applied between the drain layer DRN and the source layer SOU is increased to, for example, 60 V or 100 V, a region on which an electric field is concentrated, that is, a region in which the interval between equipotential lines is dense is not generated in the vicinity of the gate trench GTRN. For this reason, in the semiconductor device SD, it is not necessary to thicken the drift layer DRT in order to increase a withstanding voltage. Therefore, it is possible to increase the withstanding voltage while maintaining on-resistance low.

Meanwhile, the reason for the above-mentioned effect to be obtained is because, as shown by white lines in FIG. 9, when the voltage Vds increases, substantially the entirety of the region interposed by the gate trench GTRN in the drift layer DRT is depleted. The reason for such depletion is because a constant potential (source potential) is applied to the buried layer DIF1 of a second conductivity type. Particularly, in the present embodiment, the high-concentration layer DIF2 of a second conductivity type is formed in the surface layer of the buried layer DIF1 of a second conductivity type, and a constant potential is applied through the high-concentration layer DIF2 of a second conductivity type. Therefore, there is a tendency for a constant potential to be applied to the buried layer DIF1 of a second conductivity type.

In addition, in the present embodiment, since the lower layer DIF3 of a second conductivity type is formed, an electric field is not also concentrated on the lower end of the boundary insulating film SINS1. Such an effect becomes particularly large in a case where the high-concentration layer DIF2 of a second conductivity type covers the entirety of the buried layer DIF1 of a second conductivity type when seen in a plan view. For this reason, particularly, the withstanding voltage increases.

Figure 10:
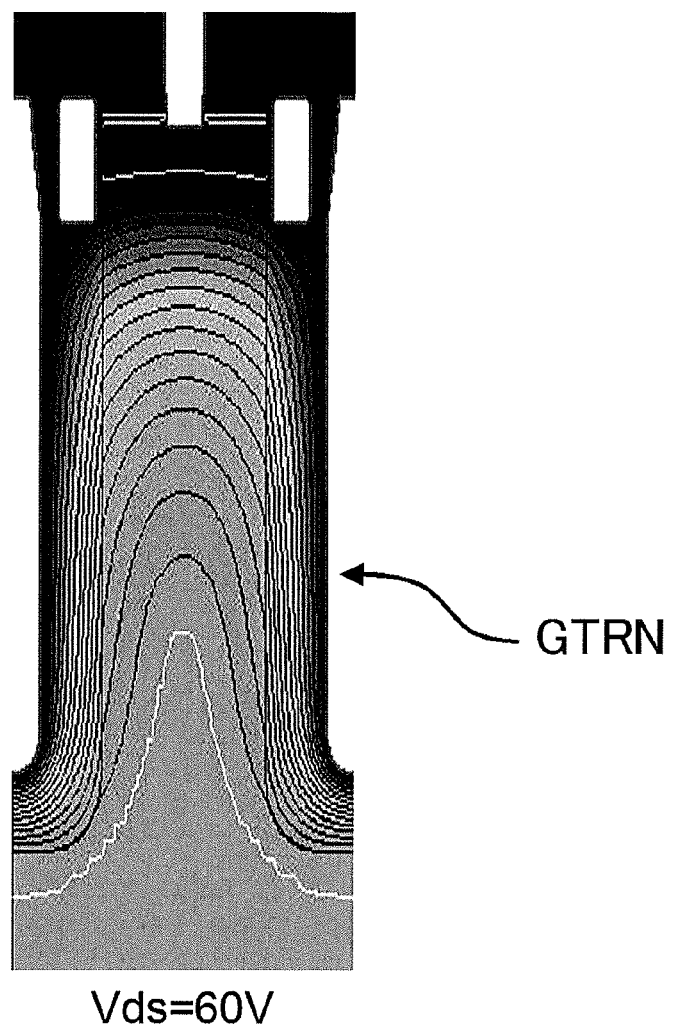
FIG. 10 is a diagram illustrating results obtained by simulating the positions of the equipotential line and the depletion layer of the vertical transistor when a buried layer of a second conductivity type, a high-concentration layer of a second conductivity type, and a lower layer of a second conductivity type are not formed.

Here, for the purpose of reference, FIG. 10 shows results obtained by simulating positions of an equipotential line and a depletion layer of the vertical transistor when the buried layer DIF1 of a second conductivity type, the high-concentration layer DIF2 of a second conductivity type, and the lower layer DIF3 of a second conductivity type are not formed. From the drawing, when the buried layer DIF1 of a second conductivity type, the high-concentration layer DIF2 of a second conductivity type, and the lower layer DIF3 of a second conductivity type are not formed, it is known that an electric field is concentrated on the lower end of the gate trench GTRN.

In addition, in the above-mentioned embodiment, the portion located at the bottom of the gate trench GTRN in the epitaxial layer EPI has the possibility of crystallinity being deteriorated due to etching when the gate trench GTRN is formed. For this reason, when the interface of PN junction is present in the bottom of the gate trench GTRN, there is the possibility of leakage and a decrease in withstanding voltage with a portion having low crystallinity in the interface as the start point. On the other hand, in the present embodiment, the lower layer DIF3 of a second conductivity type is formed in a portion located below the gate trench GTRN in the epitaxial layer EPI. For this reason, the interface of PN junction with the epitaxial layer EPI is located at a lower position than the bottom of the gate trench GTRN. Therefore, it is possible to suppress the occurrence of the leakage and the decrease in withstanding voltage.

(Second Embodiment)

Figure 11:
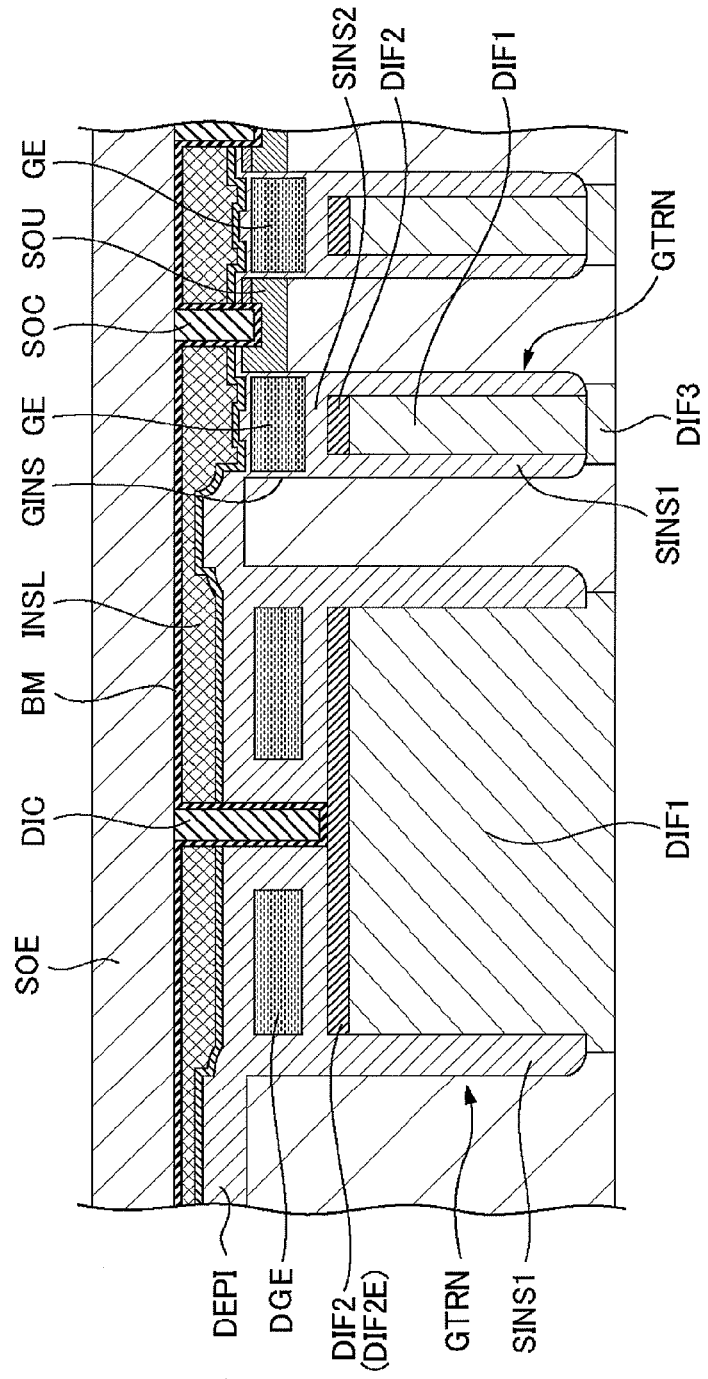
FIG. 11 is a cross-sectional view illustrating a structure of a connection portion between the high-concentration layer of a second conductivity type and a contact in a semiconductor device according to a second embodiment.

FIG. 11 is a cross-sectional view illustrating a structure of a connection portion between the high-concentration layer DIF2 of a second conductivity type and the contact DIC in a semiconductor device SD according to a second embodiment, and corresponds to FIG. 3 in the first embodiment. The semiconductor device SD according to the present embodiment has the same configuration as that of the semiconductor device SD according to the first embodiment, except for the structure of the connection portion.

In the present embodiment, the buried layer DIF1 of a second conductivity type is configured such that the region in which the exposed region DIF2E of the high-concentration layer DIF2 of a second conductivity type is formed is also set to be substantially the same height as those of other portions. The contact DIC is formed deeper than in the first embodiment. In addition, a dummy gate electrode DGE is formed in the vicinity of the contact DIC, but the dummy gate electrode DGE does not overlap the contact DIC when seen in a plan view. Meanwhile, such a configuration is obtained by, for example, forming the region in which the exposed region DIF2E is formed in the buried layer DIF1 of a second conductivity type, similarly to other regions of the buried layer DIF1 of a second conductivity type.

In the present embodiment, it is also possible to obtain the same effect as that in the first embodiment.

(Third Embodiment)

Figure 12:
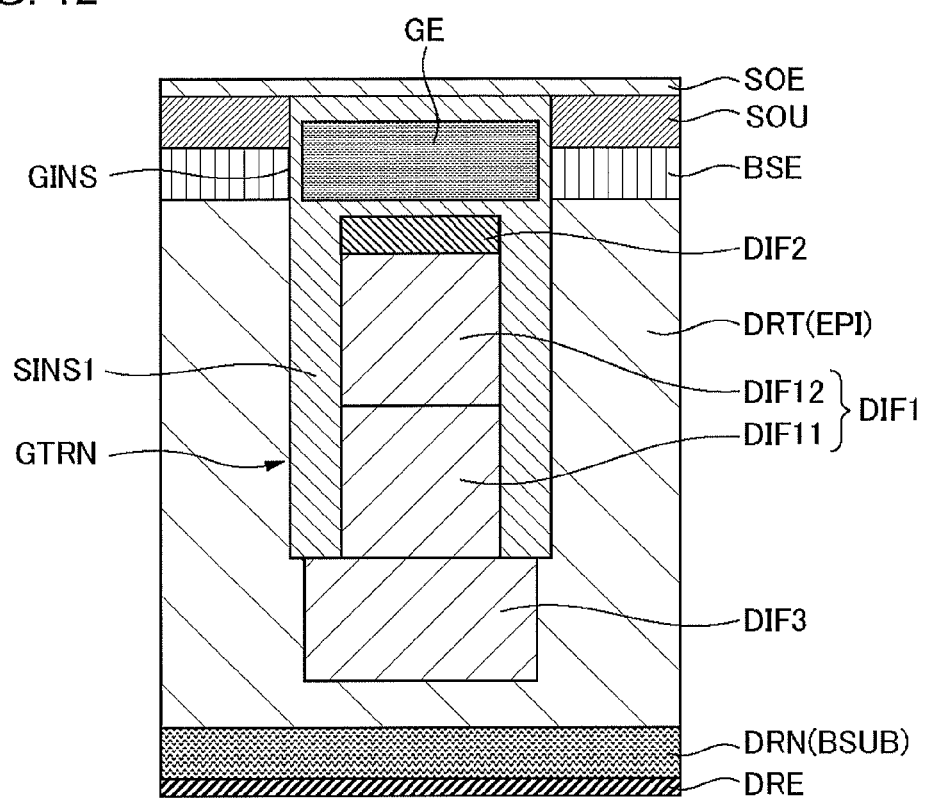
FIG. 12 is a cross-sectional view illustrating a configuration of a semiconductor device according to a third embodiment.

FIG. 12 is a cross-sectional view illustrating a configuration of a semiconductor device SD according to a third embodiment, and corresponds to FIG. 4 in the first embodiment. The semiconductor device SD according to the present embodiment has the same configuration as that of the first or second embodiment, except that the buried layer DIF1 of a second conductivity type is formed to have a multilayer structure. The multilayer structure of the buried layer DIF1 of a second conductivity type is obtained by repeating a film formation process and an etch-back process several times. In the example shown in the drawing, the buried layer DIF1 of a second conductivity type is formed to have a two-layer structure in which the buried layers DIF11 and DIF12 of a second conductivity type are laminated in this order.

The buried layers DIF11 and DIF12 of a second conductivity type are different from each other in impurity concentration. The buried layer DIF11 of a second conductivity type may have a higher or lower impurity concentration than the buried layer DIF12 of a second conductivity type.

In the present embodiment, it is also possible to obtain the same effect as that in the first embodiment. In addition, the buried layer DIF1 of a second conductivity type is formed by repeating the film formation process and the etch-back process several times. For this reason, even when the aspect ratio of the gate trench GTRN increases, it is possible to bury the buried layer DIF1 of a second conductivity type in the lower portion of the gate trench GTRN.

(Fourth Embodiment)

Figure 13:
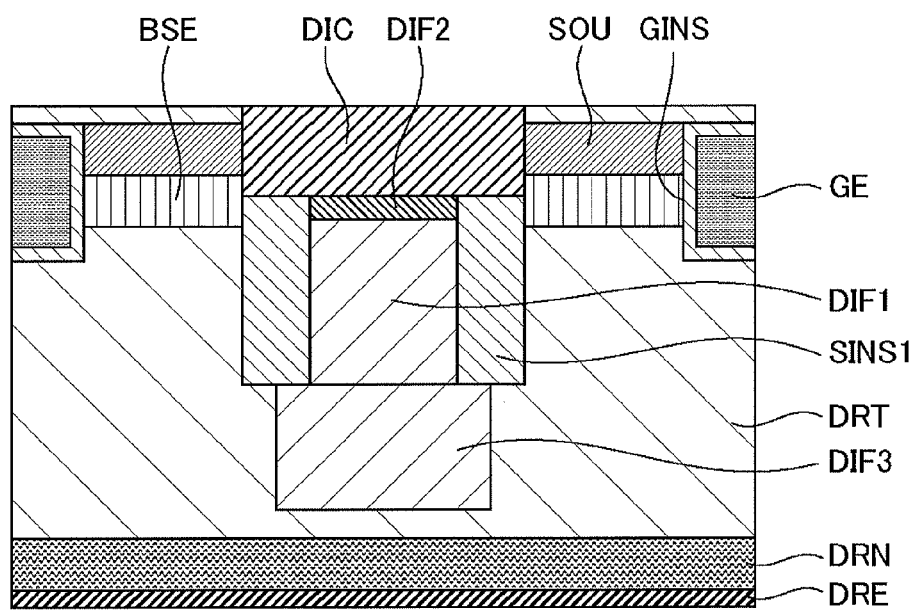
FIG. 13 is a cross-sectional view illustrating a configuration of a semiconductor device according to a fourth embodiment.

FIG. 13 is a cross-sectional view illustrating a configuration of a semiconductor device SD according to a fourth embodiment, and corresponds to FIG. 4 in the first embodiment. The semiconductor device SD according to the present embodiment has the same configuration as that of the semiconductor device SD according to any of the first to third embodiments, except for the following points.

First, when seen in a plan view, the boundary insulating film SINS1, the buried layer DIF1 of a second conductivity type, the high-concentration layer DIF2 of a second conductivity type, and the lower layer DIF3 of a second conductivity type do not overlap the gate electrode GE and the gate insulating film GINS, but are formed side by side with the gate electrode GE and the gate insulating film GINS. Specifically, the high-concentration layer DIF2 of a second conductivity type, and the lower layer DIF3 of a second conductivity type are located between the plurality of gate trenches GTRN. When seen in a plan view, the source layer SOU and the base layer BSE are formed between the gate trench GTRN and the boundary insulating film SINS1. Meanwhile, the methods of forming the boundary insulating film SINS1, the buried layer DIF1 of a second conductivity type, the high-concentration layer DIF2 of a second conductivity type, and the lower layer DIF3 of a second conductivity type are the same as those in the first embodiment.

Even in such a configuration, the portion located between the gate trenches GTRN in the drift layer DRT is depleted. Therefore, the same effect as that in the first embodiment is obtained.

(Fifth Embodiment)

Figure 14:
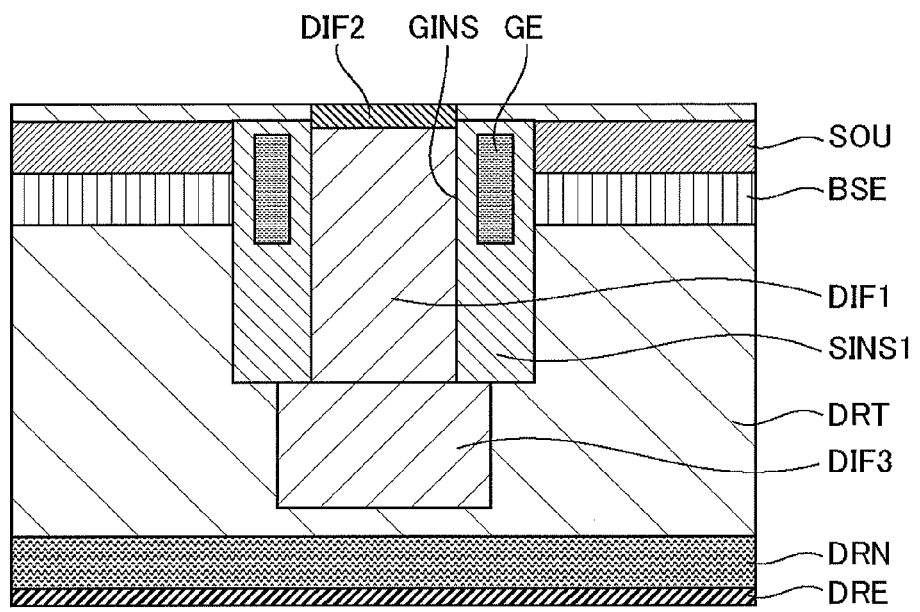
FIG. 14 is a diagram illustrating a configuration of a semiconductor device according to a fifth embodiment.

FIG. 14 is a diagram illustrating a configuration of a semiconductor device SD according to a fifth embodiment. The example shown in the drawing has the same configuration as that of the semiconductor device SD according to the fourth embodiment, except for the following points.

As mentioned above, the plurality of gate trenches GTRN are arranged in parallel with each other. The source layer SOU and the base layer BSE are alternately formed in the region located between the plurality of gate trenches GTRN. The buried layer DIF1 of a second conductivity type is formed in the remaining region between the plurality of gate trenches GTRN. The lower portion of the gate trench GTRN is buried in the boundary insulating film SINS1.

The high-concentration layer DIF2 of a second conductivity type is formed in the surface layer of the buried layer DIF1 of a second conductivity type, and the lower layer DIF3 of a second conductivity type is formed below the buried layer DIF1 of a second conductivity type.

In the present embodiment, since the drift layer DRT is depleted, the same effect as that in the first embodiment is also obtained.

As stated above, while the invention devised by the inventor has been described specifically based on the embodiments thereof, the present invention is not limited to the above-mentioned embodiments, but it goes without saying that various changes and modifications may be made without departing from the scope of the invention.

It is apparent that the present invention is not limited to the above embodiment, and may be modified and changed without departing from the scope and spirit of the invention.

What is claimed is:

1. A semiconductor device comprising:
   a first layer of a first conductivity type;
   a layer of a second conductivity type formed over the first layer of the first conductivity type;
   a second layer of the first conductivity type formed over the layer of the second conductivity type;
   a gate trench which passes through the second layer of the first conductivity type and the layer of the second conductivity type, and of which a lower end thereof reaches the first layer of the first conductivity type;
   a gate insulating film formed in an inner wall of the gate trench;
   a gate electrode buried in the gate trench;
   a buried layer of the second conductivity type formed in the first layer of the first conductivity type;
   a boundary insulating film located in a boundary between a lateral portion of the buried layer of the second conductivity type and the first layer of the first conductivity type;
   a lower layer of the second conductivity type, formed in the first layer of the first conductivity type, which is in contact with the buried layer of the second conductivity type and a lower end of the boundary insulating film;
   an electrode, formed at a higher position than the second layer of a first conductivity type, which is electrically connected to the buried layer of a second conductivity type; and
   a drain electrode formed under the first layer of the first conductivity type and electrically connected to the first layer of the first conductivity type.

2. The semiconductor device according to claim 1, wherein the lower layer of the second conductivity type covers the entirety of the buried layer of the second conductivity type when seen in plan view.

3. The semiconductor device according to claim 1, further comprising:
   a high-concentration layer of the second conductivity type of which at least a portion is located at a surface layer of the buried layer of the second conductivity type, and which has a higher impurity concentration than that of the buried layer of the second conductivity type,
   wherein the electrode is connected to the high-concentration layer of the second conductivity type.

4. The semiconductor device according to claim 1, wherein the buried layer of the second conductivity type overlaps the gate electrode when seen in plan view, and
   an upper portion of the boundary insulating film is connected to a lower portion of the gate insulating film.

5. The semiconductor device according to claim 1, wherein the buried layer of the second conductivity type and the boundary insulating film are lined up with the gate electrode and the gate insulating film when seen in plan view.

6. The semiconductor device according to claim 5, wherein a plurality of the gate trenches are formed side by side with each other,
   the gate insulating film and the gate electrode are formed in each of the plurality of gate trenches, and
   the buried layer of the second conductivity type and the boundary insulating film are located between the plurality of gate trenches when seen in plan view.

7. The semiconductor device according to claim 1, further comprising:
   a drain electrode connected to the first layer of the first conductivity type; and
   a source electrode connected to the second layer of the first conductivity type,
   wherein a voltage equal to or higher than 60 V is applied between the drain electrode and the source electrode.

8. The semiconductor device according to claim 1, wherein the layer of the second conductivity type is completely above the first layer.

9. The semiconductor device according to claim 1, wherein the lower end of the boundary insulating film partially overhangs the lower layer of the second conductivity type.

10. The semiconductor according to claim 1, wherein the buried layer is a multilayered structure including a first buried layer and a second buried layer, the first buried layer contacting the lower layer and the second buried layer contacting a top surface of the first buried layer.

11. The semiconductor according to claim 10, wherein the first buried layer has a different impurity concentration from the second buried layer.

12. A semiconductor device comprising:
   a first layer of a first conductivity type;
   a layer of a second conductivity type formed over the first layer of the first conductivity type;
   a second layer of the first conductivity type formed over the layer of the second conductivity type;
   a gate trench which passes through the second layer of the first conductivity type and the layer of the second conductivity type, and of which a lower end thereof reaches the first layer of the first conductivity type;
a buried layer of the second conductivity type formed in the first layer of the first conductivity type;
a boundary insulating film located in a boundary between a lateral portion of the buried layer of the second conductivity type and the first layer of the first conductivity type;
a lower layer of the second conductivity type, formed in the first layer of the first conductivity type, which is in contact with the buried layer of the second conductivity type and a lower end of the boundary insulating film;
an electrode, formed at a higher position than the second layer of the first conductivity type, which is electrically connected to the buried layer of the second conductivity type; and
a gate electrode formed adjacent to the boundary insulating film and outside of the gate trench.

13. A semiconductor device comprising:
a first layer of the first conductivity type;
a layer of the second conductivity type formed over the first layer of the first conductivity type;
a second layer of the first conductivity type formed over the layer of the second conductivity type;
a plurality of gate trenches formed side by side with each other, each of the gate trenches passing through the second layer of the first conductivity type and the layer of the second conductivity type, and a lower end of each of the gate trenches reaches the first layer of the first conductivity type;
a gate insulating film formed in an inner wall of each of the gate trenches;
a gate electrode buried in each of the gate trenches;
a buried layer of the second conductivity type formed in the first layer of the first conductivity type;
a boundary insulating film located in a boundary between a lateral portion of the buried layer of the second conductivity type and the first layer of the first conductivity type;
a lower layer of the second conductivity type, formed in the first layer of the first conductivity type, which is in contact with the buried layer of the second conductivity type and a lower end of the boundary insulating film; and
an electrode, formed at a higher position than the second layer of a first conductivity type, which is electrically connected to the buried layer of the second conductivity type,
wherein, when seen in plan view, the buried layer of the second conductivity type and the boundary insulating film are located between the plurality of gate trenches and are lined up with the gate electrode and the gate insulating film.

* * * * *